United States Patent [19]

Murakami et al.

[11] Patent Number: 5,088,697
[45] Date of Patent: Feb. 18, 1992

[54] HEAT TREATING APPARATUS

[75] Inventors: Seishi Murakami, Yamanashi; Kozo Kai, Fuchu; Susumu Kato, Yamanashi, all of Japan

[73] Assignee: Tokyo Electron Limited, Tokyo, Japan

[21] Appl. No.: 552,897

[22] Filed: Jul. 16, 1990

[30] Foreign Application Priority Data

Jul. 26, 1989 [JP] Japan .................................. 1-193409

[51] Int. Cl.⁵ .............................................. C21D 1/74
[52] U.S. Cl. .................................. 266/250; 204/298.36
[58] Field of Search ............... 266/249, 250, 251, 252; 204/298.36, 298.31

[56] References Cited

U.S. PATENT DOCUMENTS 3,341,371 9/1967 Baumgartner ....................... 266/250
4,195,820 4/1980 Berg ................................. 204/298.36
4,795,529 1/1989 Kawasaki et al. ............... 204/298.36

Primary Examiner—S. Kastler
Attorney, Agent, or Firm—Oblon, Spivak, McClelland, Maier & Neustadt

[57] ABSTRACT

A susceptor is located in a treating space of a CVD apparatus with a wafer placed in contact with a first surface of a susceptor. The susceptor is heated by a heating source to impart the heat to the wafer. A treating gas is supplied into a treating space and decomposed in a course of a reaction to form a film on the wafer. A guard ring is located on a second surface of the susceptor which is situated around the first surface of the susceptor. The guard ring and wafer are heated by the susceptor in the same way. The surface of the susceptor is substantially not exposed between the guard ring and the wafer and a temperature on the exposed surface of the guard ring and that on the exposed surface of the wafer are nearly equal to each other.

13 Claims, 4 Drawing Sheets

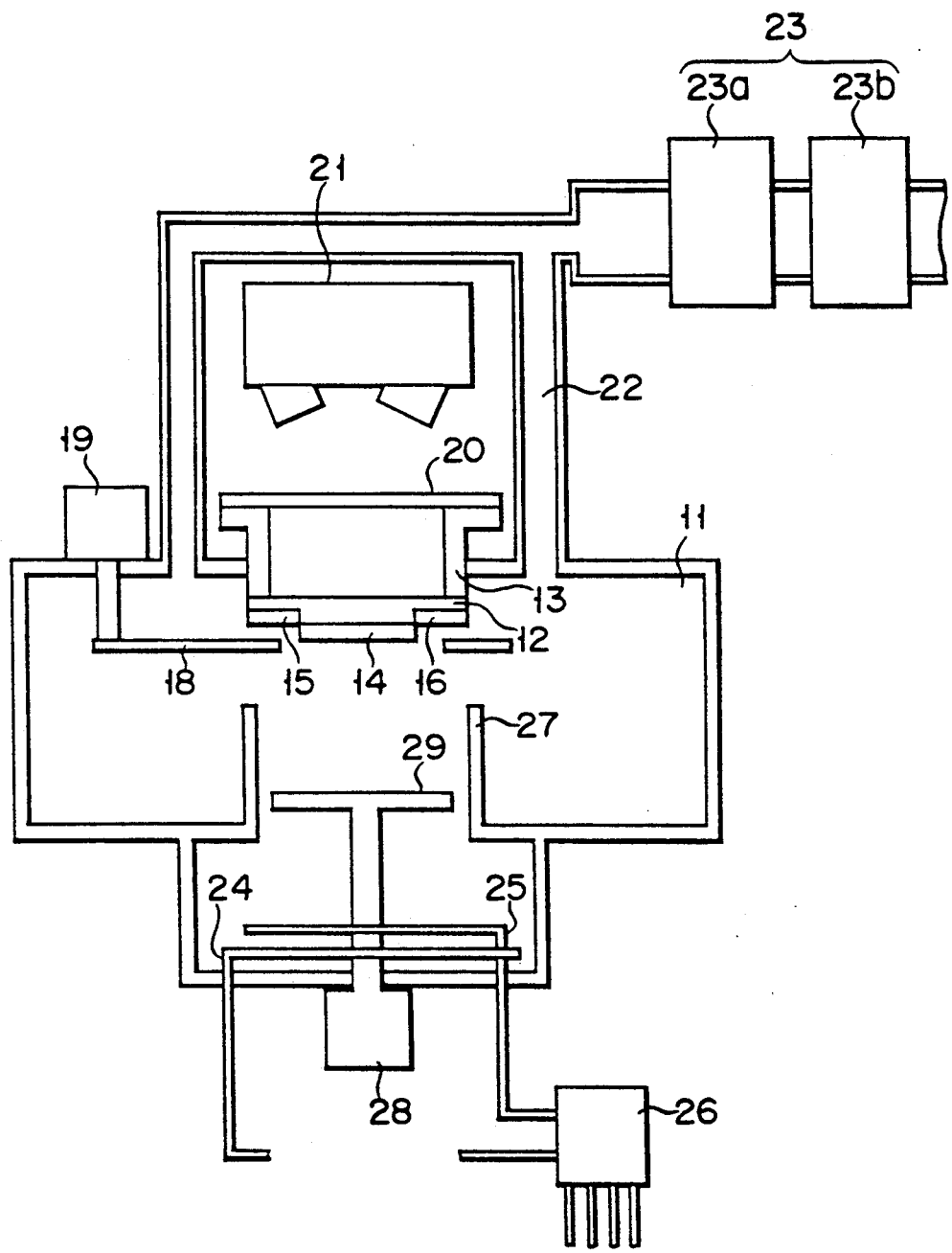
F I G. 3

HEAT TREATING APPARATUS

BACKGROUND OF THE INVENTION

1. Field of the Invention

The present invention relates to a heat treating apparatus which is suitably used for, for example, a film forming apparatus.

2. Description of the Related Art

As the technique for forming a wiring layer or layers by depositing a metal or a metal silicide film on a semiconductor IC formation circuit, use has long been made of a PVD (physical vapor deposition) method, such as vapor deposition and sputtering. In those integrated circuits, such as VLSIs, a wiring pattern is more and more microminiaturized so as to achieve a high-speed device in a high integration density. However, a poor step coverage occurs over the uneven surface of a semiconductor device, when the PVD method is employed in the manufacture of that device, resulting in the malfunction of elements or in an increased resistivity.

In an apparatus for depositing a silicon film on a semiconductor structure, a batch type hot-wall furnace has been primarily employed. However, a stricter requirement has to be met in order to eliminate a problem of contamination resulting from an entry of an outer atmosphere and to form more and more thin film on the semiconductor structure so that a semiconductor integrated circuit is microfabricated in a high integration density. In recent times, attention has been paid to a growth technique in which a film is formed over a substrate to be treated, by a single wafer-fed CVD (chemical vapor deposition) method, in a vacuum load-lock chamber-equipped apparatus through a reaction of a feed gas by the use of heat, light or plasma.

The single wafer fed CVD film growth method ensures a better step coverage over that of the PVD method and imparts no damage to a substrate to be treated and, as compared with a batch type CVD, involves no entry of an outer atmosphere into a reaction chamber due to the presence of a vacuum load-lock chamber. It is also possible to readily control a film thickness and film quality.

In this type of single wafer-fed CVD film growth method, as shown in FIG. 1, a substrate 1 to be treated is placed in contact with a heating body, such as a chuck or susceptor 2, and heated to a temperature conforming to a film formation. The heating body, such as the susceptor 2, is heated by a heating source 3, such as lamp light and resistance heat-generation heater, and serves as such. In this case, the temperature of the susceptor 2 or substrate 1 is monitored by a temperature monitor means, such as a thermocouple and radiation thermometer, and the monitor means controls the temperature of the substrate 1 during the formation of a film.

Upon a detailed examination by the inventors, it is found that the heat conduction problem arises in the conventional film apparatus at a location between the susceptor 2 and the substrate 1 and that, even if the substrate 1 is placed in contact with the susceptor 2, no equal temperature is achieved on the susceptor 2 and substrate 1, for example, the substrate is lowered in temperature to 550° C. when the susceptor is at 680° C. This is because, even if a flat contact state is visually observed between the rear surface of the substrate 1 and the mating surface of the substrate 2, it appears uneven microscopically as a point-contact state as shown in FIG. 2. Stated in another way, under a reduced-pressure condition particularly under which there is less gas conducible to the conduction of heat, the way of heat conduction is different from that under an outer atmosphere condition.

In the CVD method, a film is formed on the surface of the substrate 1 through the decomposition of a feed gas by heat, light or plasma in the course of a reaction in which case the decomposition and reaction of the feed gas rely largely on a temperature involved. In the treatment state as shown in FIG. 1, an exposed surface portion 2a of the susceptor 2 is higher in temperature than a temperature prevalent on the major surface of the substrate 1, causing the decomposition of the feed gas to be more actively done at the exposed surface portion 2a of the susceptor 2 than at the major surface of the substrate 1 in the course of a reaction. For this reason, the feed gas to be decomposed on the outer marginal portion, in particular, of the substrate 1 is deprived of by the exposed portion 2a of the susceptor, causing the film thickness to be thinner on the marginal portion of the substrate 1 than on the central portion thereof. This poses a problem of impairing the uniformity of a film thus formed under the condition as set out above.

SUMMARY OF THE INVENTION

It is an object of the present invention to provide a heat treating apparatus which can eliminate a bad effect which would otherwise be exercised upon the exposed portion of the susceptor around a substrate to be treated in the prior art apparatus.

Another object of the present invention is to provide a heat treating apparatus which can uniformly treat a whole surface of a layer or object to be treated through a decomposition of a treating gas in the course of a reaction to achieve a substantially uniform whole surface film on a substrate.

In order to achieve the aforementioned object of the present invention, there is provided a heat treating apparatus, comprising:

means for defining a treating space for surrounding a substrate to be heat-treated;

means for reducing a pressure in the treating space;

a susceptor having a first surface, in the treating space, contacting with a minor surface of the substrate and adapted to impart heat to the substrate through the first surface;

heating means for heating the susceptor; and a guard ring having a rear surface contacting with a second surface of the susceptor which is formed around the first surface of the susceptor, the guard ring being heated by the susceptor, whereby the surface of the susceptor is covered or hardly exposed, between the guard ring and the substrate.

The second heat treating apparatus of the present invention, compared with the first heat treating apparatus, further includes means for supplying a predetermined treating gas into the treating space to allow it to produce a reaction on the exposed surface of the substrate.

The guard ring can be so formed as to have its surface arranged substantially flush with the first surface of the susceptor or with the main surface (exposed surface) of the substrate.

The guard ring is secured by screws to the susceptor, fitted in the stepped portion of the susceptor or mounted by cramp means on the susceptor.

The first heat treating apparatus can be applied to a baking apparatus, annealing apparatus and so on.

The second heat treating apparatus of the present invention can be applied to a CVD growth apparatus, ashing apparatus, etching apparatus, ion implanting apparatus, etc.

In the present apparatus, the susceptor's exposed surface around the substrate is covered with the guard ring. Heat is conducted in substantially the same fashion from the susceptor to the guard ring as from the susceptor to the substrate, that is, a temperature gradient from the susceptor to the exposed surface of the guard ring drops abruptly (drops in temperature) at a boundary between the second surface of the susceptor and the rear surface of the guard ring. This temperature gradient encounters nearly the same temperature variation as that from the susceptor to the major surface of the substrate to be treated. According to the present invention, a temperature on the major surface of the substrate becomes nearly equal to that on the exposed surface of the guard ring situated around the substrate, allowing a uniform heating treatment to be achieved over the whole major surface of the substrate. The use of the treating gas ensures its decomposition over the whole major surface of the substrate in the course of the reaction and hence the formation of a uniform film on the substrate.

An abrupt temperature change at a location between the susceptor and the substrate is remarkable under a reduced-pressure condition under which there is less gas serving as a temperature transmission medium. Thus the presence of the guard ring effectively serves its purpose when the vacuum level becomes higher, for example, when a pressure is below 100 Torrs.

For the guard ring, use may be made of any heat-resistant material, of which graphite is a proper one. It is to be noted that graphite is normally used for the susceptor. The graphite is excellent in workability. Further, in a film forming apparatus, the graphite hardly allows by-product films to be free therefrom and hence ensures no flying of particles of the by-product films. It is possible to employ, for the guard ring, silicon which is the same material for the to be treated substrate. However, the silicon is poor in its workability as well as its retention property to by-product films as set out above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a diagrammatical view generally showing a heat treating apparatus according to a first embodiment of the present invention;

DETAILED DESCRIPTION OF THE PREFERRED EMBODIMENTS

It well be explained below an embodiment of the present invention with reference to the accompanying drawings in which the embodiment is applied to a single wafer-fed type CVD apparatus for the formation of a high-melting-point metal silicide thin film during the manufacture of a semiconductor device.

FIG. 3 is a view generally showing a whole structure of a CVD apparatus. A treating chamber 11 of the CVD apparatus is cylindrically formed using, for example, aluminum and has its interior held in an airtight state with the wall surface settable by a cooling mechanism in a cool state.

Figure 4:
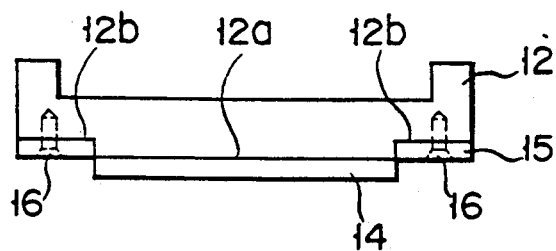
FIG. 4 is a side view diagrammatically showing the wafer, susceptor and guard ring employed in the apparatus shown in FIG. 3.

A susceptor 12 is provided at an upper zone of the treating chamber 11 and composed of a projecting carbon graphite plate of, for example, 20 mm in thickness. The susceptor 12 is supported, by a hollow-cylindrical support member 13, with its projecting section down. As shown in FIG. 4, a first surface 12a of the projecting section of the susceptor 12 is so dimensioned as to be equal to the size of a substrate to be treated, such as a semiconductor wafer 14. The semiconductor wafer 14 is aligned with the forward end surface of the projecting section of the susceptor 12, as shown in FIG. 4, with its major surface (the surface to be treated) down in which case the opposite surface (the minor surface) of the semiconductor wafer 14 is placed in contact with the first surface 12a of the susceptor 12.

Figure 1:
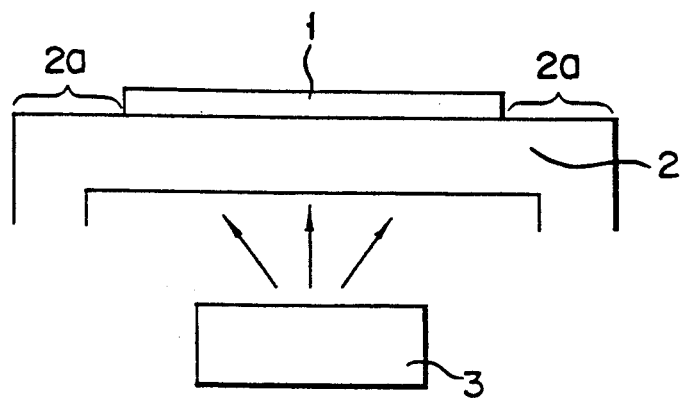
FIG. 1 is a side view diagrammatically showing a wafer-to-susceptor relation of a conventional heat treating apparatus.
Figure 2:
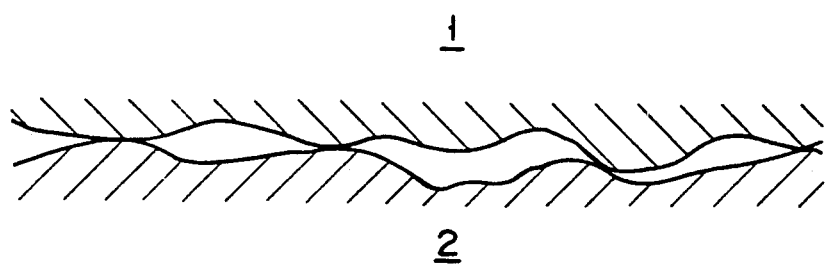
FIG. 2 is a cross-sectional view showing a state in which a wafer contacts with a susceptor on the apparatus shown in FIG. 1.

A guide ring 15 is fitted, as shown in FIG. 4, to that surface 12b of the projecting susceptor 12 which is formed around the first surface 12a of the susceptor 12. The guard ring 15 is formed of a carbon graphite plate of, for example, 3 mm in thickness and secured, by fixing screws 16, to the susceptor 12. The state in which the rear surface of the guard ring 15 contacts with the second surface 12b of the susceptor 12, upon being examined on a micro scale, is as shown in FIG. 2. Thus heat from the susceptor 12 is transmitted to the guard ring 15 in substantially the same fashion as that in which it is transmitted to the wafer 14. As a result, the major surface of the wafer 14 is made nearly equal in temperature to the temperature of the corresponding front surface of the guard ring 15.

Figure 5:
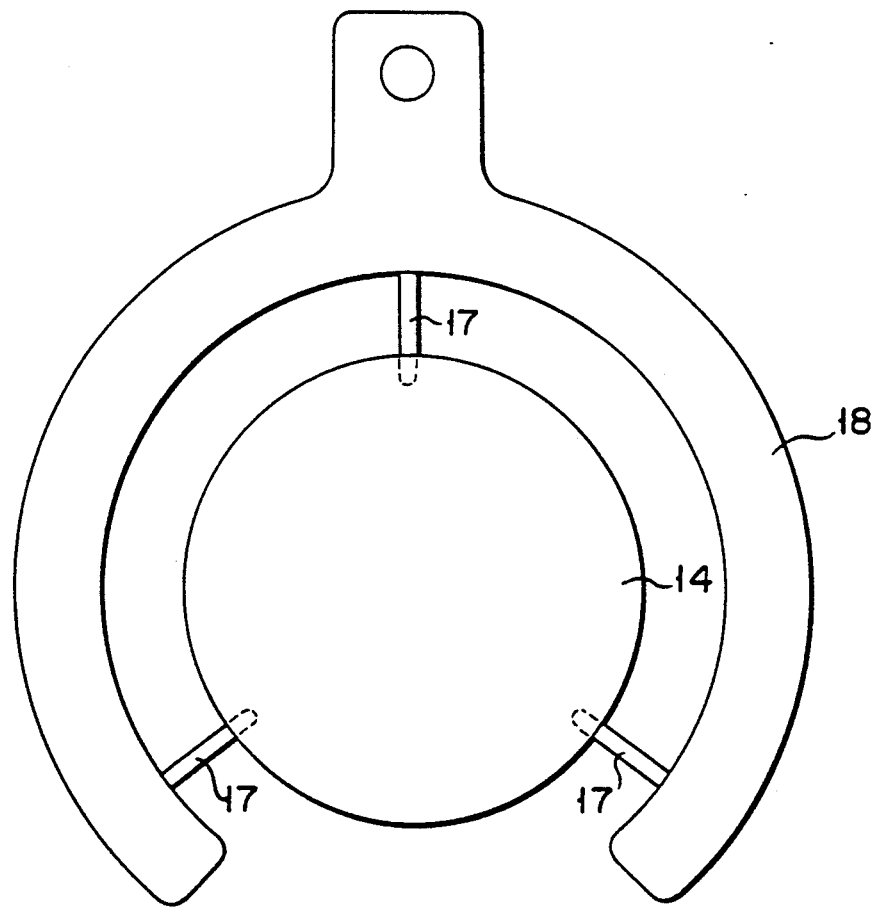
FIG. 5 is a plan view showing a relation of the wafer and support in the apparatus shown in FIG. 3.

As shown in FIG. 5, the semiconductor wafer 14 is set relative to the susceptor 12 such that it is supported by three arms 17 of a wafer support 18 at the marginal edge portion of the wafer 14. The wafer support 18 can be liftably moved by a lifting mechanism 19, such as an air cylinder. At the time of loading and unloading a semiconductor wafer, the wafer support 18 is lowered by the lifting mechanism 19 and a semiconductor wafer 14 is placed on the wafer support 18, while, at a time of forming a film on the wafer, the wafer support 18 is lifted by the lifting mechanism 19 so that the semiconductor wafer 14 is pressed against the first surface 12a of the susceptor 12.

An IR (infrared lamp) 21 is provided, over the susceptor 12, as a heating means for heating the susceptor 12 to, for example, 300° to 1000° C. through a transparent window of, for example, quartz glass.

A plurality of, or four for example, exhaust tubes 22 are opened at an upper wall of the treating chamber 11 at a location around the susceptor 12. The exhaust tubes 22 are connected to, for example, a series array of a turbo molecular pump 23a and dry pump 23b and are used to reduce pressure in the treating chamber 11 to a desired level and to exhaust a reaction gas, etc. An oxidation-type gas introducing mechanism 24 and reduction-type gas introducing mechanism 25 are arranged, as gas introducing mechanisms, in a lower zone of the treating chamber 11 at a location opposite to the susceptor 12 and composed of an annular tube having a plurality of (10, for example) very small outflow holes, not shown. The oxidation type gas introducing mechanism 24 and reduction type gas introducing mechanism 25 are connected via a flow control mechanism 26 to a gas supply source, not shown, enabling a gas mixture of a film growth gas (oxidation type gas), such as VF$_6$ (tungsten hexafluoride), and carrier gas, such as Ar (argon), or a gas mixture of a film growth gas (reduction type gas), such as SiH$_2$Cl$_2$ (dichlorsilane), and carrier gas, such as Ar (argon), to be supplied into the treating chamber 11.

A cylindrical gas duct 27 is provided between the susceptor 12 on one hand and the oxidation type gas introducing mechanism 24 and reduction type gas introducing mechanism 25 on the other. A blackbody treatment, such as the coating of a Black Alumite, graphite, etc., is made on the inside surface of the cylindrical gas duct 27. This is done by suppressing the reflection of a heat ray (infrared ray) coming from the susceptor 12 heated by the IR lamp 21 and thus preventing the gas introducing mechanisms 24 and 25 from being heated. It is to be noted that it is possible to, with the inside surface of the gas duct formed as a rough surface, irregularly reflect a heat ray on that rough surface and to suppress a temperature rise at the oxidation type gas introducing mechanism 24 and reduction type gas introducing mechanism 25. It is also possible to reflect an incoming heat ray from the susceptor in a direction toward other than a gas passage.

A gas flow control disc 29 is provided inside the gas duct 27.

The gas flow control disc 29 can be lifted by a drive mechanism 28 to a proper adjustment position where a reaction gas uniformly flows into contact with a surface to be treated of the semiconductor wafer 14. It is thus possible to control a flow of the reaction gas.

The formation of a film on the semiconductor wafer 14 by the present apparatus will be explained below.

First, the susceptor 12 is initially heated by the IR lamp 21 to 600° to 700° C., for example, to 680° C. A semiconductor wafer 14 is placed on the susceptor 12 through a load/unload mechanism, not shown, of the treating chamber 11 and supported by the wafer support 18. In this case, the semiconductor wafer 14 is correctly prepositioned to the susceptor 12 to align the wafer 14 with the first surface 12a. The second surface 12b of the susceptor 12 which is situated around the first surface 12a of the susceptor 12 is covered with the guard ring 15. After the semiconductor wafer 14 has been placed on the susceptor 12, the surface of the susceptor 12 is not exposed toward the side of the major surface of the semiconductor wafer 14.

With the semiconductor wafer 14 heated to the aforementioned temperature through the susceptor 12, the treating gas is introduced from the oxidation type gas introducing mechanism 24 and reduction type gas introducing mechanism 25 into the treating chamber 11 and the interior of the treating chamber 11 is so controlled as to be set to a pressure P of 10≦P≦1000 Torrs. By so doing, the following reaction progresses, depositing WSix on the major surface of the semiconductor wafer 14 and forming a tungsten silicide film there.

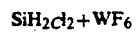

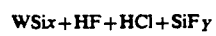

The treating gas is introduced from the gas introducing mechanisms 24 and 25 into the treating chamber 11, reaching the front surface of the guard ring 15 and the major surface of the semiconductor wafer 14 heated to substantially the same temperature by radiant heat from the susceptor 12 heated by the IR lamp 21. When this is done, the treating gas is decomposed through a reaction as shown above to form a tungsten silicide film. At that time, since the semiconductor wafer 14 and guard ring 15 are heated to substantially the same temperature, that reaction is produced uniformly on the surfaces of the guard ring and semiconductor wafer 14 heated by the heat coming from the susceptor 12.

Upon being measured by a thermocouple under the condition that the temperature of the susceptor 12 was, for example, 680° C., the semiconductor wafer 14 was at 574° C. on its major surface and the guard ring 15 was at 543° C. on its front surface.

As appreciated from the above, the semiconductor wafer 14 and guard ring 15 are set at substantially the same temperature with respect to the temperature of the susceptor 12. Further, since, during the film formation treatment, the surface of the susceptor 12 is not exposed, the treating gas is uniformly decomposed, through a reaction, on the major surface of the semiconductor wafer 14 to form a flat film.

The guard ring 15 is provided around the semiconductor wafer 14 located on the susceptor 12, enabling the guard ring 15 to be set to be lower in temperature than the susceptor 12. As a material for the guard ring 15 use can be made of not only carbon graphite the same as that of the susceptor as set out above but also other proper materials which can compensate a temperature difference between the surfaces of the wafer and susceptor while being heated by the susceptor. The choice of a material as well as the choice of a proper contact state between the susceptor and guard ring can lower the surface temperatures of the guard ring to a proper temperature.

Figure 6:
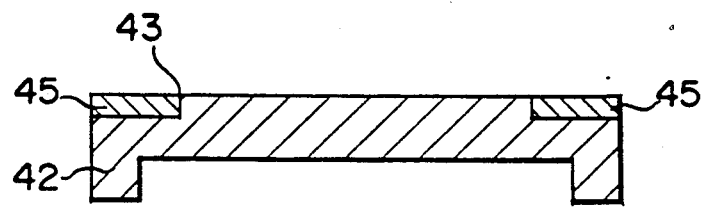
FIG. 6 is a side, cross-sectional view showing a modified unit of a susceptor and guard.

FIG. 6 is a cross-sectional view showing a structure of a susceptor and guard ring in a second embodiment of the present invention. In this embodiment, the guard ring 45 is embedded in the stepped outer marginal portion of the susceptor 42. This structure is suitable for the case in which the susceptor has its surface upwardly directed, rather than that downwardly directed of the first embodiment as shown in FIGS. 3 and 4. In the case where the susceptors 12 and 42 and guard rings 15 and 45 have their surfaces formed, respectively, flush with each other in a pair, the substrate to be treated, that is the wafer, may be placed in a manner to extend onto the guard rings 15 and 45.

Figure 7:
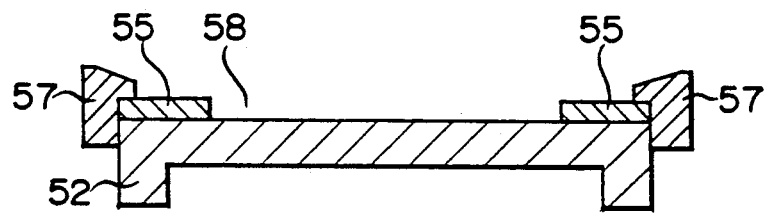
FIG. 7 is a side, cross-sectional view showing another modified unit of a wafer and susceptor.

FIG. 7 is a cross-sectional view showing a structure of a susceptor and guard ring in a third embodiment of the present invention. In the third embodiment, the guard ring 55 is mounted on the susceptor 52 by a plurality of clamp members 57. A substrate to be treated, that is a wafer, is placed in a recess 58 formed at a central portion of the guard ring 55. Here, the recess 58 needs to have its diameter formed to be equal to, or somewhat greater than, the diameter of the wafer. It is desired that the thickness of the guard ring 55 be substantially equal to that of the wafer.

The third embodiment has an advantage in that a treating gas flows in a horizontal stream over the whole area of the substantially even surface of the wafer and guard ring 55 to enable it to be uniformly decomposed in the course of a reaction. Since, on the other hand, the guard ring has to be replaced with another guard ring in accordance with the size of the wafer, it is appropriate to employ the clamp members 57, instead, which make it easier to mount the wafer on the structure as set out above.

In the respective embodiments, the guard ring is washed by flowing a cleaning gas, such as an etching gas, in a reaction space after a predetermined treating operation has been achieved.

The present invention can be applied not only to a wafer whose film formation surface is oriented sideways, not the up- nor down-directed as already set out above, but also to the formation of a film on a plurality of wafers at a time, that is, in a batch production.

Further, the present invention can be applied not only to the aforementioned CVD film growth method but also to a heat treating apparatus for performing a heat treatment, such as baking and annealing, and to a heat treating apparatus for performing a predetermined treatment by a gas under a predetermined heat condition, such as ashing, etching and ion implantation.

Although the aforementioned embodiments have bee explained as treating a semiconductor wafer, it can also be applied to various processes, such as one for LCDs.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is

1. A heat treating apparatus comprising:
   means for defining a treating space for surrounding a substrate to be heat-treated;
   means for reducing a pressure in the treating space;
   a susceptor having a first surface, in the treating space, contacting with a minor surface of the substrate and adapted to impart heat to the substrate through the first surface;
   heating means for heating the susceptor; and
   a guard ring having a rear surface contacting with a second surface of the susceptor which is formed around the first surface of the susceptor, the guard ring being heated by the susceptor, whereby
   the surface of the susceptor is substantially entirely covered by the guard ring and the substrate.

2. The apparatus according to claim 1, wherein the first surface of said susceptor is provided nearly flush with a front surface of said guard ring.

3. The apparatus according to claim 1, wherein a major surface of said substrate is nearly aligned to a front surface of said guard ring.

4. The apparatus according to claim 1, wherein said guard ring is secured by screws to said susceptor.

5. The apparatus according to claim 1, wherein said guard ring is fitted to a stepped outer marginal portion of said susceptor.

6. The apparatus according to claim 1, wherein said guard ring is mounted by clamp members on said susceptor.

7. The apparatus according to claim 1, wherein said heating means comprise baking means.

8. The apparatus according to claim 1, wherein said heating means comprise annealing means.

9. A heat treating apparatus comprising:
   means for defining a treating space for surrounding a substrate to be heat-treated;
   means for reducing a pressure in the treating space;
   means for supplying a predetermined treating gas into the treating space to allow it to develop a reaction on a major surface of the substrate;
   a susceptor having a first surface, in the treating space, in contact with a minor surface of the substrate and adapted to impart heat to the susceptor;
   heating means for heating the susceptor; and
   a guard ring having a rear surface contacting with a second surface of the susceptor which is formed around the first surface of the susceptor, the guard ring being heated by the susceptor, whereby
   the surface of the susceptor is substantially entirely covered by the guard ring and the substrate.

10. The apparatus according to claim 9, wherein said treating gas supplying means comprise chemical vapor supplying means.

11. The apparatus according to claim 9, wherein said treating gas supplying means comprise ashing gas supplying means.

12. The apparatus according to claim 9, wherein said treating gas supplying means comprise etching gas supplying means.

13. The apparatus according to claim 9, wherein said treating gas supplying means comprise ion etching gas supplying means.

* * * * *